United States Patent [19]
Aybay

[11] Patent Number: 5,751,729
[45] Date of Patent: May 12, 1998

[54] METHOD AND APPARATUS FOR EFFICIENT SELF TESTING OF ON-CHIP MEMORY

[75] Inventor: Gunes Aybay, Burlingame, Calif.

[73] Assignee: Sun Microsystems, Inc., Mountain View, Calif.

[21] Appl. No.: 853,314

[22] Filed: May 8, 1997

Related U.S. Application Data

[62] Division of Ser. No. 674,354, Jul. 1, 1996, Pat. No. 5,677,913.
[51] Int. Cl.⁶ .................................................. G06F 11/00
[52] U.S. Cl. .................................................. 371/21.1
[58] Field of Search ........................ 371/21.1, 22.1, 371/22.5, 22.6, 27.1, 27.5; 324/158 R, 73 R

[56] References Cited

U.S. PATENT DOCUMENTS

| | | | |
|---|---|---|---|
| 4,641,308 | 2/1987 | Sacarisen et al. | 371/16 |
| 4,862,067 | 8/1989 | Brune et al. | 324/73 |
| 5,638,382 | 6/1997 | Krick et al. | 371/22.5 |

*Primary Examiner*—Vincent P. Canney
*Attorney, Agent, or Firm*—Blakely Sokoloff Taylor & Zafman

[57] ABSTRACT

An electronic device and method for utilizing two extra microcode instructions to generate a set of test patterns which provide complete bitwise self-testing of the on-chip memory of a microcode sequencer. The self-testing sequence can be triggered by a single external interface event.

7 Claims, 6 Drawing Sheets

FIG. 7

METHOD AND APPARATUS FOR EFFICIENT SELF TESTING OF ON-CHIP MEMORY

This is a divisional of application Ser. No. 08/674,354, filed on Jul. 1, 1996 now U.S. Pat. No. 5,677,913

BACKGROUND OF THE INVENTION

1. Field of the Invention

The present invention relates to the field of electronics. More particularly, the present invention relates to a method and apparatus for self testing on-chip memory after manufacture.

2. Description of Related Art

For many years, controllers utilizing microcode (referred to as "microcode controllers") have been widely used by computers (e.g., mainframes, personal computers, etc.) to control data flow in "intelligent" devices. An "intelligent" device is an integrated circuit targeted to perform a variety of complex functions such as a microprocessor, microcontroller, Application Specific Integrated Circuit "ASIC" and the like. Each of these microcode controllers comprise a microcode sequencer featuring a state machine functioning in accordance with microcode stored therein.

Initially, microcode sequencers were developed with an on-chip, fixed memory (e.g., read only memory "ROM"). When microcode contained within the microcode sequencer became obsolete, either the controller or an entire microcode engine (if an on-chip controller is utilized) had to be replaced. A "microcode engine" includes at least one microcode sequencer and an intelligent device fabricated as a single integrated circuit.

In order to increase their longevity and flexibility, microcode sequencers have been implemented with on-chip random access memory ("RAM"). Thus, normally after power-on reset, the microcode may be downloaded from an external interface (e.g., at least one pin of the package containing the microcode sequencer) in order to update the microcode after manufacture. This update capability provides the SRAM-based microcode sequencer with an ability to perform additional functions, or to perform the same functions with greater efficiency. In addition, a SRAM-based microcode sequencer allows its functions to be debugged and modified after the controller has been fabricated, packaged or installed in a product that has already been sold to a customer (i.e., in the field).

Although the conventional SRAM-based microcode sequencer has some advantages over fixed microcode sequencers, it also possesses a number of inherent disadvantages. One disadvantage associated with a SRAM-based microcode sequencer is that its on-chip SRAM is difficult to test extensively after manufacture. The reason is that the on-chip SRAM is not directly accessible to an external test source (e.g., a Very Large Scale Integration "VLSI" tester). Rather, on-chip SRAM contained in these microcode sequencers is tested by writing and reading several test patterns from the external test source to each of its memory locations through the external interface of the SRAM-based microcode sequencer. This testing sequence requires a significant amount of time in terms of the number of test cycles performed by the external test source.

One possible solution to overcome the above-identified disadvantage is to configure the external interface to allow the entire microcode to be readable and writable therethrough. This typically requires additional logic to be implemented in the microcode read data path, which is usually the most critical path of the microcode sequencer. Moreover, writing and reading microcode locations one at a time with different test patterns can be quite time consuming in terms of cycles required by the external test source. Clearly, it would be desirable to test the entire on-chip SRAM with a minimal amount of interaction with the external interface and with the highest possible speed. This capability not only reduces the testing time required by the external test source after manufacturing, but also can be used to perform power-up or diagnostic memory self tests in the field.

Another disadvantage is that testing of multiple controllers are performed serially. In cases where more than one microcode sequencer is integrated on a single element (e.g., die, chip, etc.), testing these functional units through the external interface needs to be performed serially, wherein a first test sequencer and corresponding SRAM is tested, next a second sequencer/SRAM and so on.

An alternative solution to the testing difficulties of SRAM-based microcode sequencers is to integrate some built-in self test ("BIST") structure to each SRAM. BIST structures utilizing pseudo-random test generators and signature elements (e.g., linear feedback shift registers) have been extensively used in the industry to test random logic and data path configurations. However, the use of BIST structures poses a disadvantage in that its size may be quite large in proportion to the SRAM being tested. This may unnecessarily increase the size of the microcode controller thereby increasing its manufactured cost and reliability. Moreover, address and data paths of the memory needs to be multiplexed for self test operation, which increases the delay on the critical path on the microcode instruction fetch loop.

Therefore, it is a desire to utilize existing microcode sequencer logic to generate the test patterns and drive the memory under Test mode without reliance on additional logic or augmenting the delay on the critical read data path.

SUMMARY OF THE INVENTION

The present invention relates to the utilization of two extra microcode instructions to generate a set of test patterns which provide complete bitwise testing of the on-chip memory of a microcode sequencer. The self-testing sequence can be triggered by a single external interface event. A signature element is updated after each read cycle of the test. Upon completion of the test, the contents of the signature element are output to be compared against an expected value. In case any of the memory locations cannot be written or read correctly, these contents will be different than the expected value, and the chip can be marked as faulty.

BRIEF DESCRIPTION OF THE DRAWINGS

The features and advantages of the present invention will become apparent from the following detailed description of the present invention in which.

DESCRIPTION OF THE PREFERRED EMBODIMENT

The present invention describes a self-testing microcode sequencer and its associated scheme for testing on-chip memory after manufacture. As discussed below, the self-testing microcode sequencer is capable of operating in either a "Test" mode or a normal "Operation" mode. For the purpose of this application, discussion will focus on the circuitry and scheme used for testing an embodiment of the self-testing microcode sequencer during the "Test" mode. Thus, well-known circuits, devices and the like may not be discussed herein in order to avoid obscuring the present invention.

Figures 1, 1A:
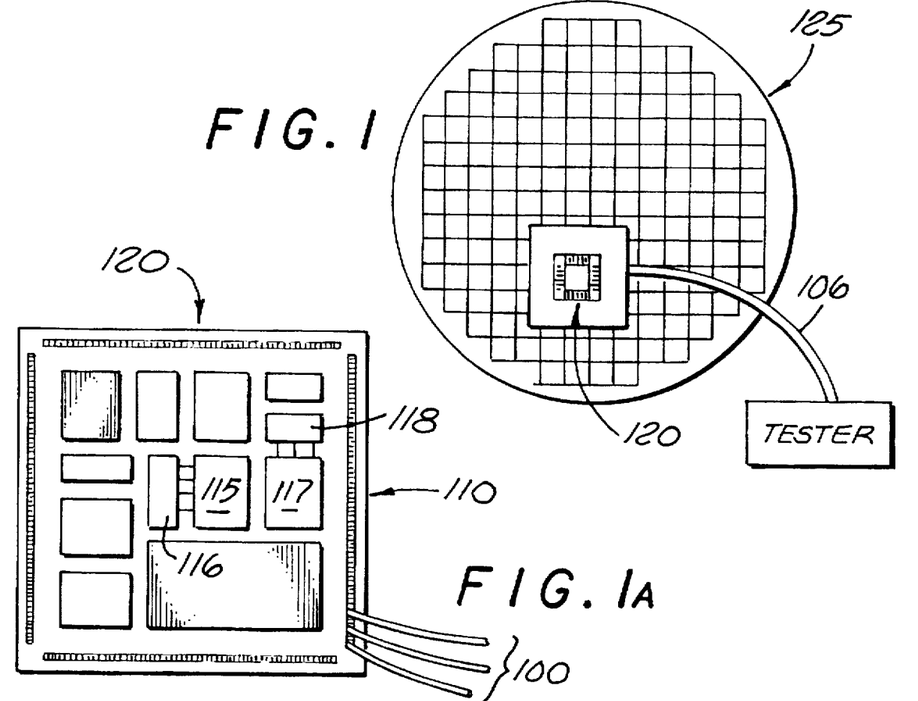
FIG. 1 is a perspective view of a system used for testing a self-testing microcode sequencer employed in an integrated circuit fabricated on a silicon wafer.
Figure 2:
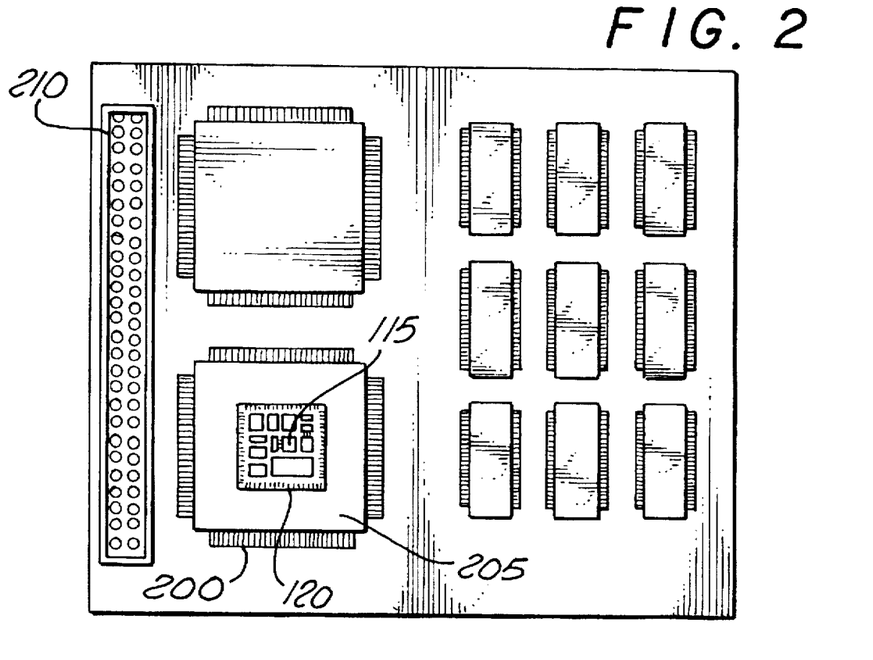
FIG. 2 is a perspective view of another system used for testing a self-testing microcode sequencer integrated on a die and encapsulated within an integrated circuit package.

Referring to FIGS. 1-2, a system configured to read results of a self-test operation performed by a self-testing microcode sequencer after manufacture is shown. In FIGS. 1 and 1A, a self-testing microcode sequencer 115 and its on-chip memory (e.g., SRAM 116) are fabricated on a die 120 of a silicon wafer 125 to control data flow of an intelligent device (e.g., a multimedia processor 130). A measuring instrument (e.g., a probe or circuit board) 100 is coupled to an external test source (e.g., VLSI tester) 105. In order to obtain results of a self-test operation performed internally within the self-testing microcode sequencer 115, the measuring instrument 100 is coupled to one or more pads 110 on the die 120 which are electrically coupled with a signature element (not shown) of the self-testing microcode sequencer 115.

It is contemplated, however, that more than one self-testing microcode sequencer 115 may be fabricated on the die 120 as illustrated in FIG. 1A by the presence of a second self-testing microcode sequencer 117 and SRAM 118. In this type of implementation, the self-testing microcode sequencers 115 of the present invention test their own RAM thereby making it possible to test a number of microcode sequencers in parallel, contrary to prior SRAM-based microcode sequencers.

After supplying power to the die 120 and either completing a power-on reset sequence or completing an event (e.g., a "write" to a particular memory address or sending a particular kind of packet through the interface pins or asserting a pin), the self-testing microcode controller 115 enters into a "Test" mode to test each bit of on-chip memory of the self-testing microcode sequencer 115 by writing data into each bit or group of bits, and subsequently reading that bit or a group of bits to update contents of its signature element. Preferably, the contents of the signature element are updated every read cycle. Upon completion of the Test mode, the final contents of the signature element are read by the external test source and compared with an expected value stored therein to determine whether or not on-chip memory of the self-testing microcode controller 115 is operating properly.

As shown in FIG. 2, another system configured to read results of a self-test operation performed by the self-testing microcode sequencer 115 is shown. The measuring instrument is a connector 210 coupled to the external test source (e.g., a computer) through the communication link. The external test source is programmed to execute a predetermined test program. This causes the external test source 205 to propagate signaling to the connector 210 which routes test information from the die 120 to one or more pin(s) 200 of an integrated circuit ("IC") package 205. The IC package 205 encapsulates the self-testing microcode sequencer 115. It is contemplated that the signals may be routed to more than one self-testing microcode sequencer.

Figure 3:
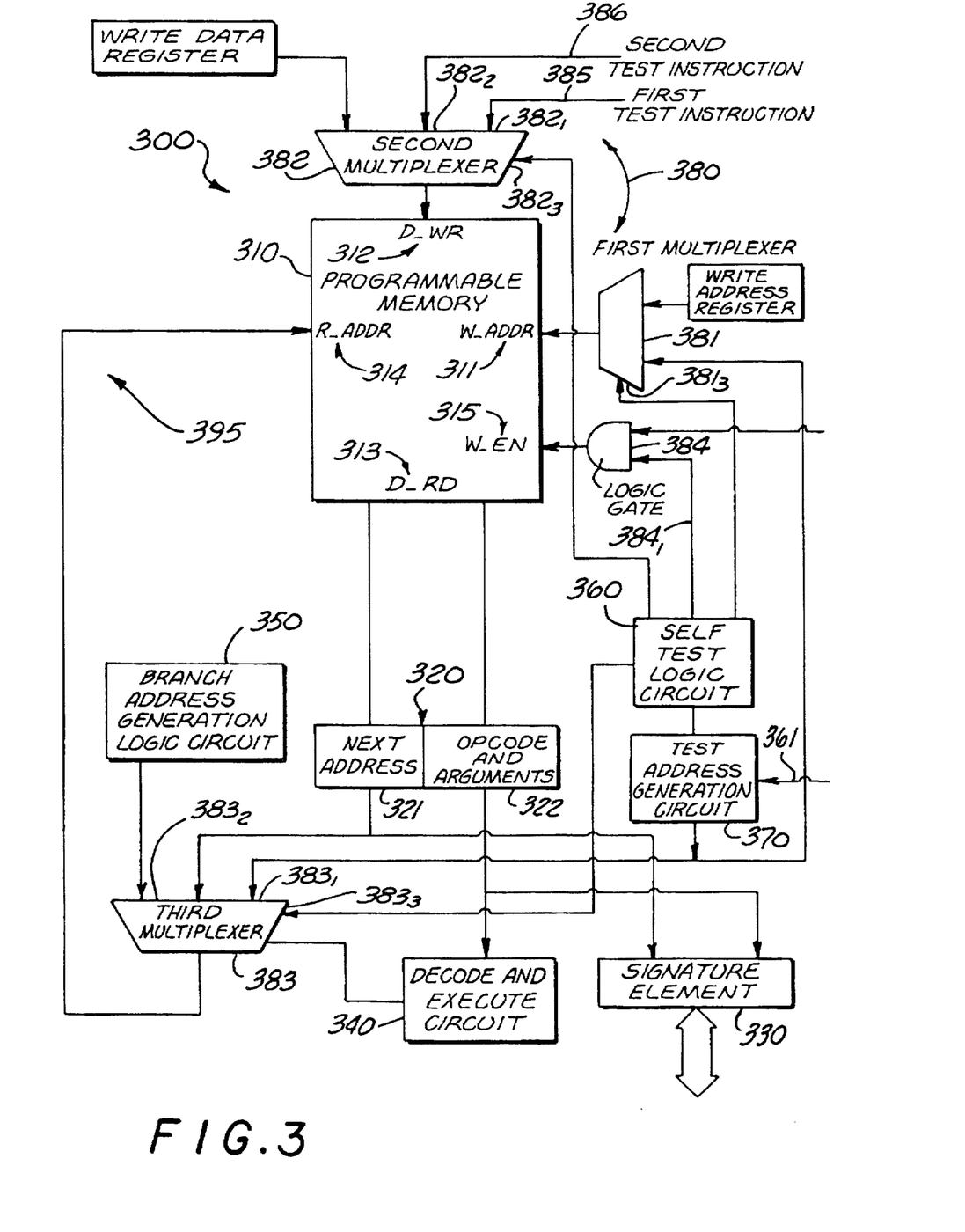
FIG. 3 is a block diagram of one embodiment of the self-testing microcode sequencer.

Referring now to FIG. 3, one embodiment of a self-testing microcode sequencer 300 is shown. Normally, after a power-on reset sequence is completed or after a particular event occurs (e.g., a write to a particular microcode address), the microcode sequencer 300 is placed in the Test mode. In Test mode, an on-chip memory element 310 of the microcode sequencer 300 is tested to determine whether or not the memory element 310 is operating properly. Such testing normally occurs after fabrication of an integrated circuit incorporating the microcode sequencer; however, the testing sequence may be utilized after the integrated circuit incorporating the self-testing microcode sequencer has been encapsulated within an integrated circuit package as shown in FIG. 2, or subsequently thereafter, placed in the field.

The self-testing microcode sequencer 300 comprises the memory element 310, a first storage element 320, a signature element 330, a decode and execute circuit 340, a branch address generation logic circuit 350, a self-test logic circuit 360, test address generation circuit 370, and a plurality of logic gates 380. The plurality of logic gates 380 include, but are not limited to a first multiplexer 381, a second multiplexer 382, a third multiplexer 383 and a logic gate (e.g., an AND gate) 384. The circuitry responsible for testing of the memory element 310 during Test mode includes at least the self-test logic circuit 360, the test address generation circuit 370 and the plurality of logic gates 380. Thus, a minimal amount of additional circuitry is added to provide self-testing capability and such circuitry is not implemented within the critical read path denoted by data flow lines 395.

Figure 4:
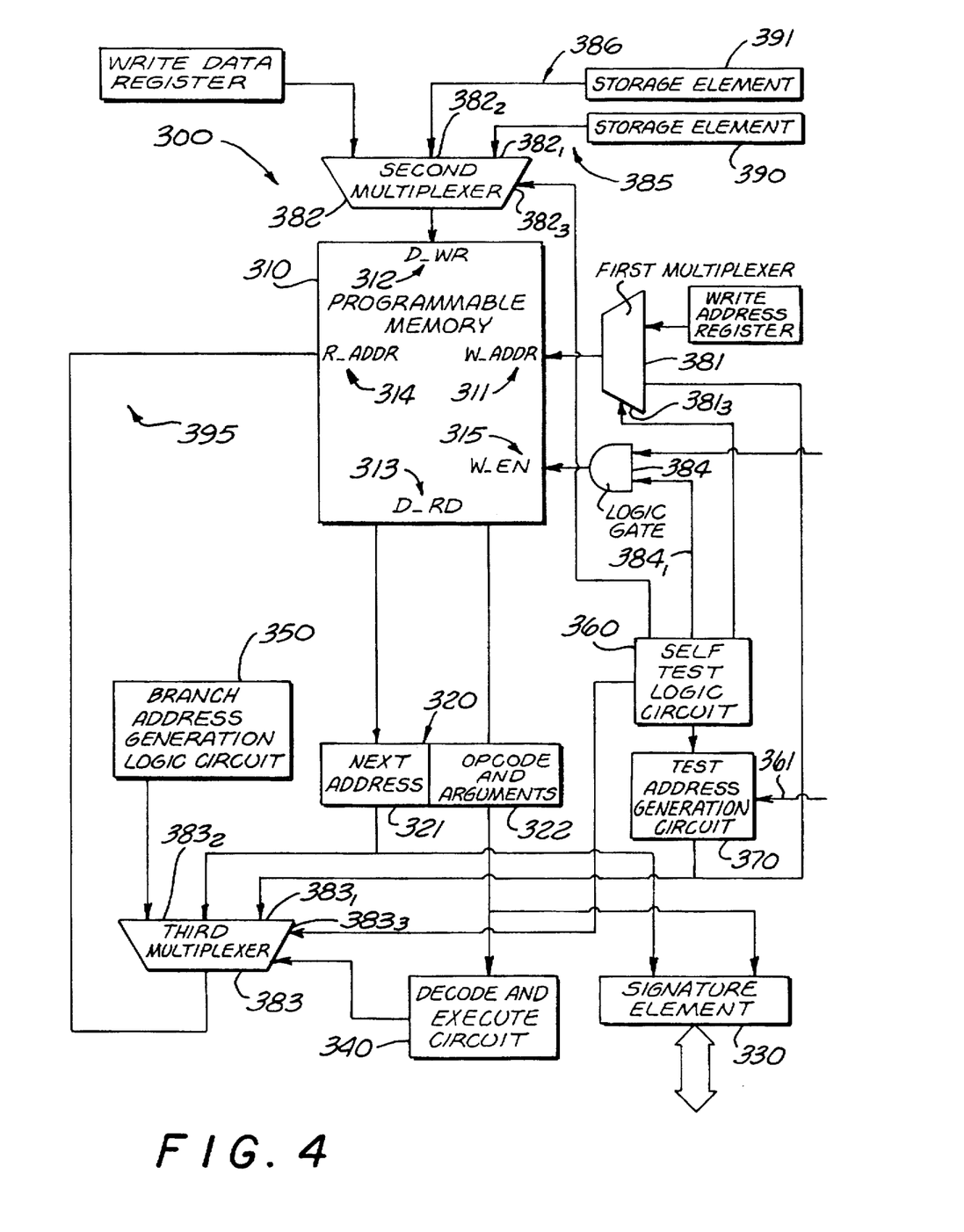
FIG. 4 is a block diagram of a second embodiment of the self-testing micro-code sequencer.

As shown in FIG. 3, a plurality of test instructions 385–386 are hard-wired into corresponding data inputs $382_1$–$382_2$ of the second multiplexer 382. It is contemplated, however, that a plurality of storage elements 390–391 may be used to contain the corresponding plurality of test instructions 385–386 to be written into the memory element 310, as shown in FIG. 4. Preferably, the plurality of storage elements 390–391 are registers having the same bit width as the word width of the memory element 310, although any bit width may be used.

Referring to both FIGS. 3 and 4, the memory element 310 comprises programmable memory, such as SRAM. It is contemplated, however, that other types of programmable memory (e.g., flash, EPROM, etc.) may be used in lieu of SRAM. Access to the contents of the programmable memory is provided by a plurality of ports including, but not limited to a write address ("W_ADDR") port 311, a data write ("D_WR") port 312, a data read ("D_RD") port 313, a read address ("R_ADDR") port 314 and a write enable ("W_EN") port 315. The bit width of D_WR port 312 and D_RD port 313 normally have a bit-width that match the word width of the memory element used to store the microcode. The width can be modified as a design choice. The width of the W_ADDR and R_ADDR ports 311 and 314 are determined by the number of words in the memory element 310.

Outputs of the plurality of logic gates 380, namely the first multiplexer 381, the second multiplexer 382, the third multiplexer 383 and the logic gate 384, are coupled to the W_ADDR, D_WR, R_ADDR and W_EN ports 311–312 and 314–315, respectively. Collectively, the plurality of logic gates 380 are implemented to enable self-test operations to be performed on the memory element 310 when under control of the self-test logic circuit 360, without interfering with the typical operations on the microcode sequencer. The self-test logic circuit 360 is coupled to select inputs $381_3$, $382_3$ and $383_3$ of the plurality of multiplexers 381–383 and a first input $384_1$ of the logic gate 384. Upon receiving a self test mode signal via control line 361 indicating that a self-testing sequence is to commence, the self-test test logic circuit 360 appropriately selects various inputs to be transferred from multiplexers 381–383 and controls the output of the logic gate 384. The self-test logic circuit 360 may include combinatorial logic, state machine, controller ASIC or any other circuitry capable of performing its functionality.

More specifically, the first multiplexer 381 receives a write address from the test address generation circuit 370. The test address generation circuit 370 is coupled to the self-test logic circuit 360 to receive a RESET signal when the Test mode is selected, causing the test address generation circuit 370 to re-start its count. The test address generation circuit 370 is combinatorial logic or other well-known circuitry that operates as a counter in which its count value is transferred to the first multiplexer 381 to provide address locations for data (e.g., a test pattern of one of the plurality of test instructions 385–386) concurrently being transferred through the D_WR port 312 into the memory element 310.

Referring still to FIGS. 3 and 4, the second multiplexer 382 receives as input at least the plurality of test instructions 385 and 386, although it is contemplated that one or more than two test instructions may be used as input(s). These plurality of test instructions have binary representations which are complementary to one another in order to fully test each memory bit of the programmable memory. For example, a first test instruction 385 may have an alternating bit pattern of binary ones "1" and zeroes "0", beginning with "1". Such testing is accomplished by writing the first test instruction to the memory element, and (ii) executing the first test instruction. This execution causes the first test instruction to write itself to the memory location pointed to by the count value produced by the test address generation circuit 370, and thereafter indexes the count value. This process continues until the test address generation circuit 370 has counted through the entire address range of the programmable memory. Next, after the contents of the memory element 310 has been read, a second test instruction 386 having a second test pattern, being the complement to the first test pattern, undergoes the same testing procedure as the first test instruction 385. Thus, each memory location in the programmable memory is toggled to test both states and all memory locations are written and read a value which is different than its neighboring memory location.

In Test mode, during a "write" cycle, a test instruction and the count value, representing a memory location where the instruction is to be written, are transferred through the D_WR port 312 and the W_ADDR port 311, respectively. This transfer may be concurrent or in reasonable temporal proximity. The W_EN port 315 is configured to control the state of the programmable memory 311. The logic output of the logic gate 384 is coupled to the W_EN port 315 such that an active control signal from the self-test logic circuit 360 places the programmable memory into a "write" state, thereby allowing data to be written therein. Similarly, an inactive control signal from the self-test logic circuit 360 places the programmable memory into a "read" state, allowing data to be read therefrom when requested.

Likewise, during a "read" cycle in Test mode, the D_RD port 313 is used to receive data from the memory location, designated by the address input into the R_ADDR port 314. The self-test logic circuit 360 selects the third multiplexer 383 to propagate the count value, produced by the self-address generation circuit 370, to the R_ADDR port 314. Moreover, the W_EN port 315 receives an inactive control signal from the self-test logic circuit 360 to place the memory element 310 in the "read" state.

Consequently, the memory element 310 fetches the data associated with the count value and transmits that data through the D_RD port 313. This data is loaded into the first storage element 320 including a first portion 321 including a next address (i.e., normally used as the address of the next instruction in conventional testing), and a second portion 322 including operation code ("opcode") and any arguments. In normal operation, the "next address" represents a pointer to the location of the next instruction in the memory element 310. In test mode, the address of the next instruction to be loaded to the instruction register 320 is taken from the test address generation circuit 370 through the third multiplexer 383. Thereafter, data contained within the first portion 321 is routed to a second input $383_2$ of the third multiplexer 383 and the signature element 330. The data associated with the second portion 322 is routed to the decode and execute logic circuit 340 and the signature element 330.

Typically, the signature element 330 is a plurality of linear feedback shift registers which are well-known in the art. The linear feedback shift registers are devices operating in such a manner that an expected pattern develops in the registers upon inputting a sequence of known patterns after a number of cycles. The contents of the signature element 330 are updated every read cycle and used by the external test source to determine if the memory element 310 is operating correctly.

As further shown in FIGS. 3 and 4, the decode and execute circuit 340 is circuitry normally used to select between propagating the next address into the R_ADDR port 314 or another address provided by the branch address generation logic circuit 350, if the opcode indicates that the instruction being read is a branch (or jump) instruction.

Figure 5:
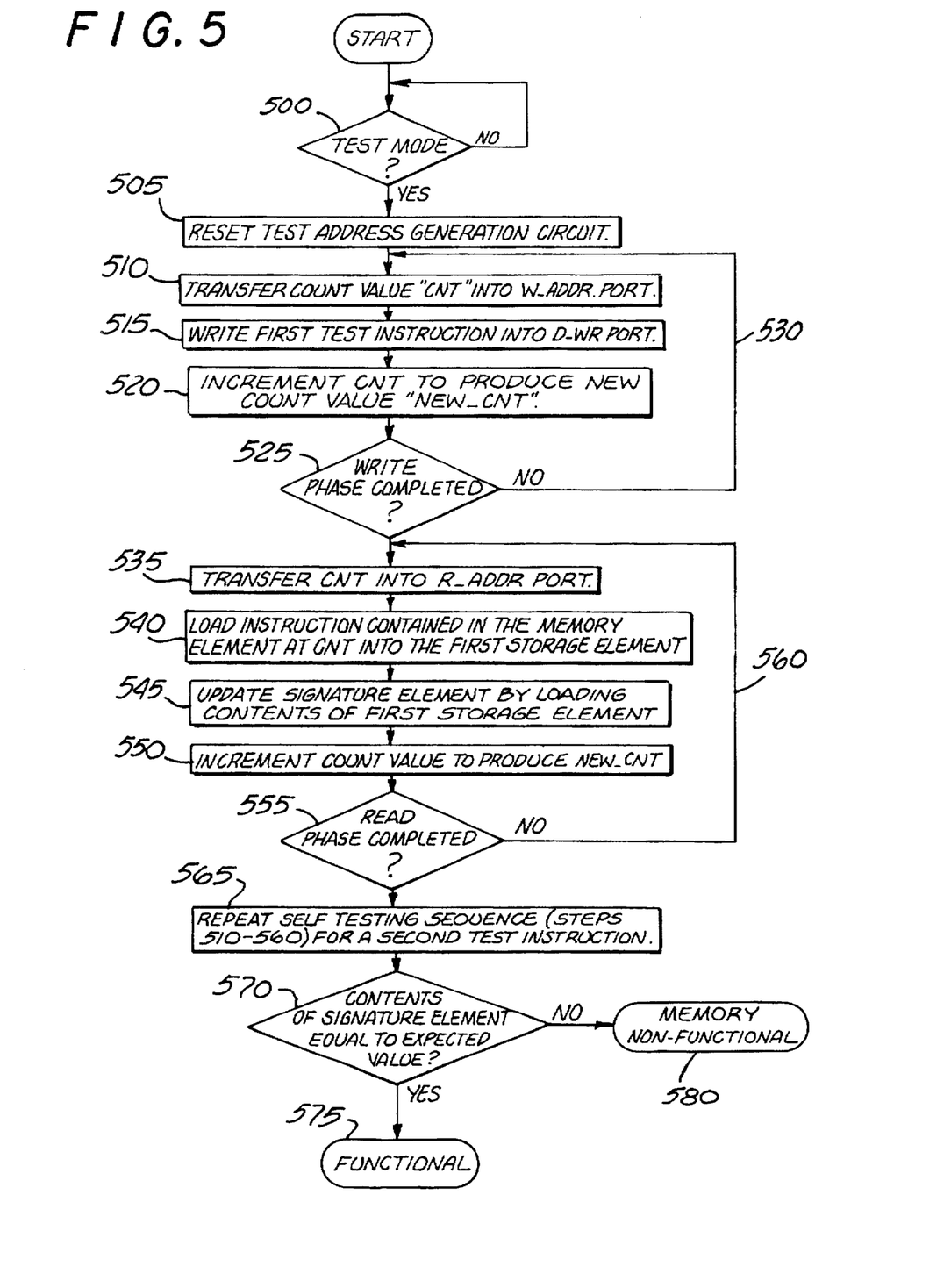
FIG. 5 is a flowchart diagram of one embodiment of the self-testing sequence performed by the self-testing microcode sequencer of FIGS. 3 or 4.

Referring now to FIG. 5, the testing sequence of the self-testing microcode sequencer is shown. It is contemplated that the self-testing may be performed in parallel by multiple microcode sequencers, provided a common control signal to place the microcode sequencers in Test mode is routed to each of these microcode sequencers. First, in Step 500, the self-testing microcode sequencer determines whether a self-testing sequence has been requested. Such determination is triggered by an event (e.g., end of a power-on reset, control signal, etc.). If so, the test address generation circuit is reset to begin the counting at a count value ("CNT"), which corresponds to an address of a first memory location of the memory element (Step 505). Next, the count value is transferred into the W_ADDR port by the test address generation circuit (Step 510). Additionally, a first test instruction having a first test pattern is written into the D_WR port in order to write the first test pattern into the memory element at an address designated by the count value (Step 515). The writing of the first test pattern may be concurrent with inputting the count value or subsequent thereto.

After writing the first test pattern into the memory element, the test address generation circuit increments the count value to produce a new count value ("NEW_CNT") and determines whether the memory element has been completely written (Steps 520 and 525). This is accomplished by the test address generation circuit comparing its former count value (e.g., CNT) to the known last address of the memory element. If so, the self-testing sequence continues to Step 535. Otherwise, the first test pattern is written into the memory element at a memory location corresponding to NEW_CNT and the write phase of the self-testing sequence continues until the former count value is equal to the last address (Step 530).

Upon completing the write phase of the self-testing sequence, the count value, equal to the count value after reset, is transferred from the test address generation circuit into the R_ADDR port to begin the read phase (Step 535). Next, an instruction, contained in the memory element at an address represented by the count value, is read from the D_RD port and loaded into the first storage element (Step 540). The contents of the first storage element are routed to update the signature element for comparison at a later time (Step 545).

Thereafter, the test address generation circuit increments the count value to produce a new count value ("NEW_CNT") and determines whether the entire contents of the memory element have been read (Steps 550 and 555). If the entire contents of the memory element have not been read, the newly incremented count value is input into the R_ADDR port and the operations of Steps 535–555 are performed (Step 560). Otherwise, another write and read phase of the self-testing sequence is performed for the second test instruction, having a second test pattern being a binary complement of the first test pattern, to fully test both states of each bit of the memory element (Step 565). In other words, Steps 510–560 are performed for the second test instruction.

Thereafter, the contents of the signature element are compared with an expected value stored by the external test source (Step 570). If the contents are equivalent to the expected value, the on-chip memory element is deemed to be functional (Step 575). Otherwise, the on-chip memory fails the self-testing sequence and is deemed to be non-functional or faulty (Step 580).

Figure 6:
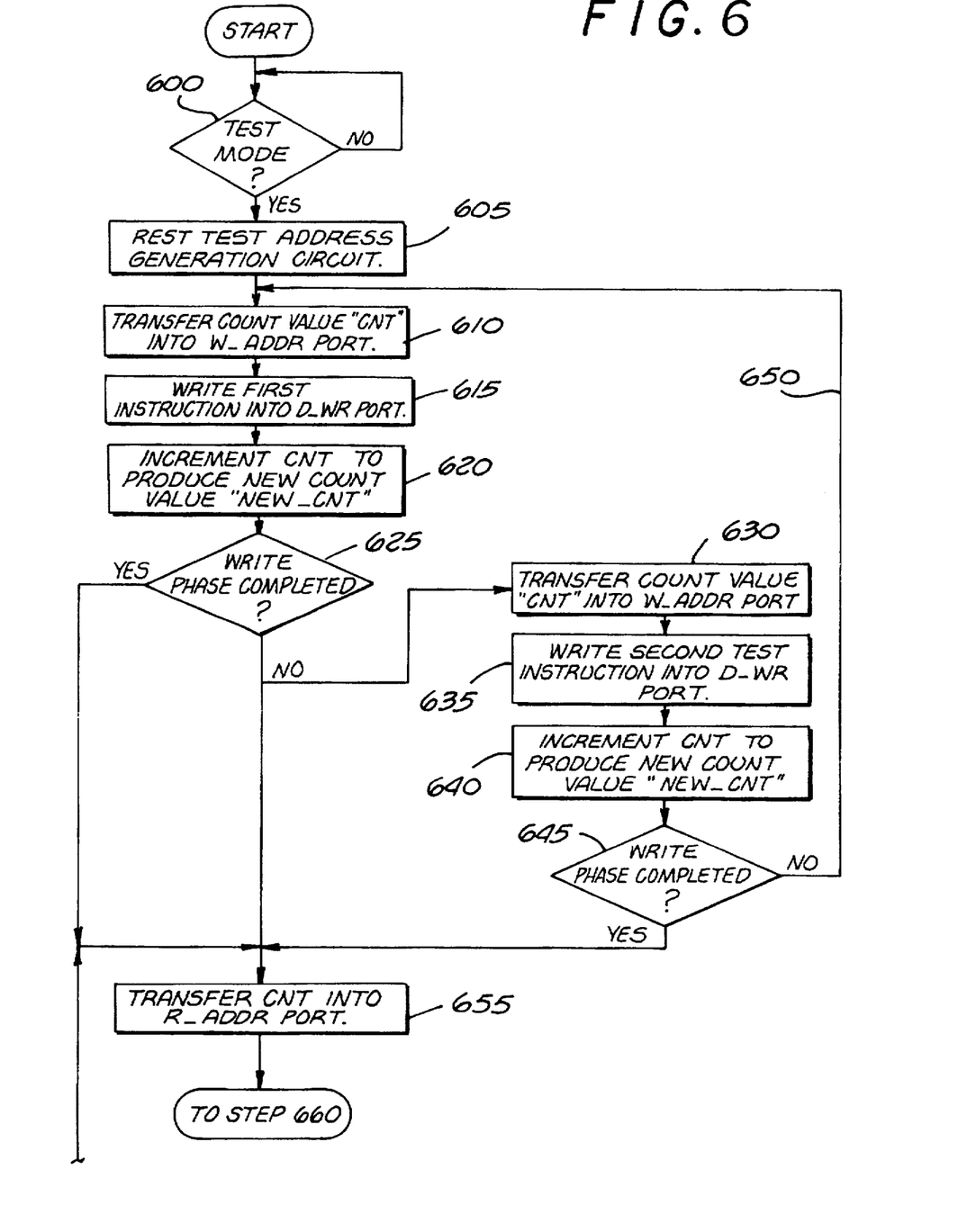
FIGS. 6 and 7 are flowchart diagrams of another embodiment of the self-testing sequence performed by the self-testing microcode sequencer of FIGS. 3 or 4.

Referring now to FIG. 6, it is contemplated that the first and second test patterns can be alternatively written into the memory element (Steps 610–645). For example, in the write phase, the first test pattern can be written into the memory element for a first count value (Steps 610–625) while the second test pattern can be written into the memory element for a second count value (Steps 630–645). The second count value would be equal to the incremented first count value. This type of process can be continued until the memory is completely written in a checkerboard type pattern in memory. The read phase would be performed in substantially the same manner (Steps 655–680). However, the write-read phases of the self-testing sequence would be repeated with the second test pattern being written, in the alternative, before the first test pattern in order to perform a bitwise test both binary states of each bit of memory (Step 685).

Figure 7:
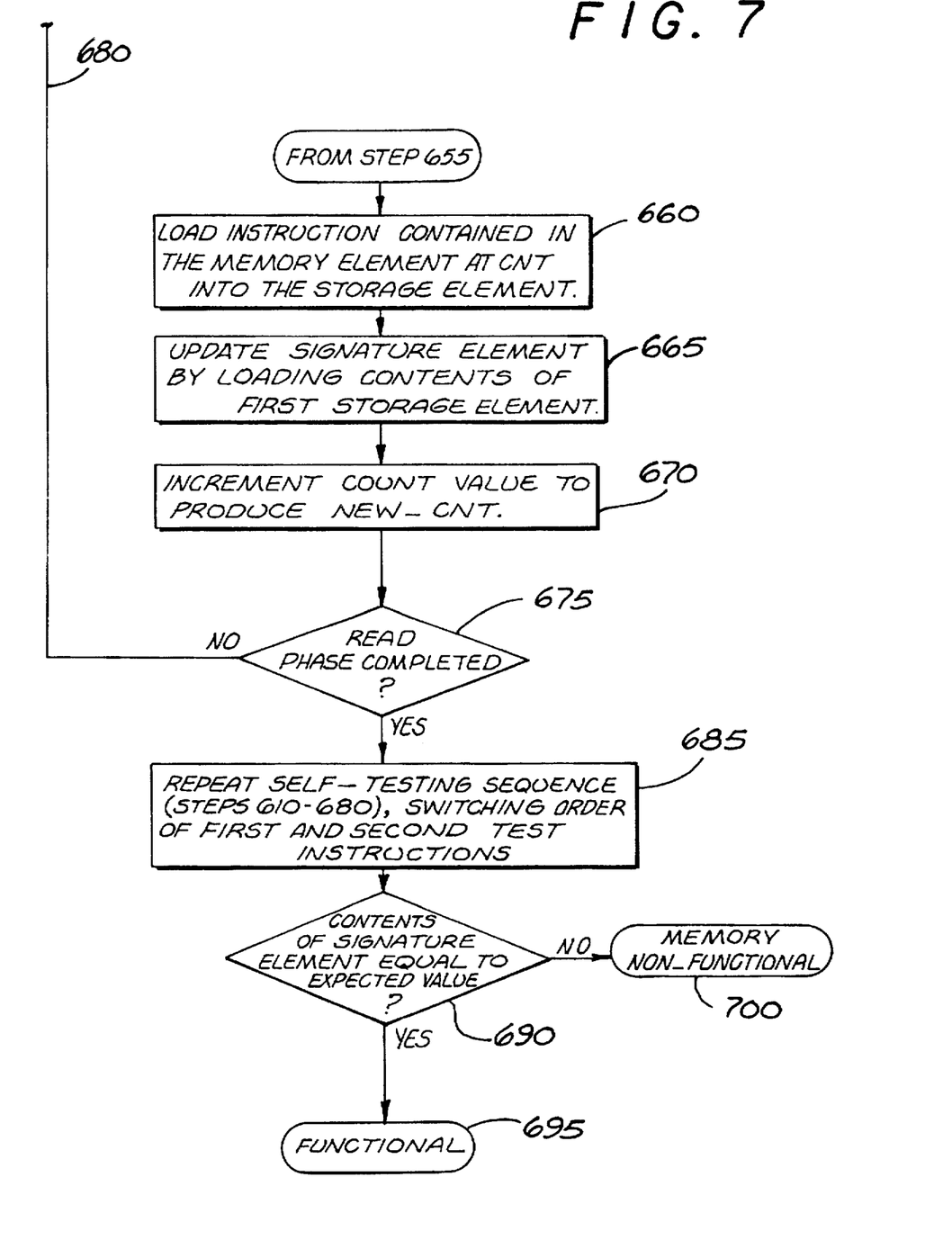

Thereafter, the contents of the signature element are compared with an expected value stored by the external test source (Step 690). If the contents are equivalent to the expected value, the on-chip memory element is deemed to be functional (Step 695). Otherwise, the on-chip memory fails the self-testing sequence and is deemed to be non-functional (Step 700).

The present invention described herein may be designed in many different methods and using many different configurations. While the present invention has been described in terms of various embodiments, other embodiments may come to mind to those skilled in the art without departing from the spirit and scope of the present invention. The invention should, therefore, be measured in terms of the claims which follow.

What is claimed is:

1. An integrated circuit chip comprising:

a package; and an integrated circuit encapsulated within said package, said integrated circuit configured to be controlled by at least one microcode sequencer, each of said at least one microcode sequencer being capable of self-testing its internal memory.

2. The integrated circuit chip according to claim 1, wherein said self-testing of each of said at least one microcode sequencer may be in parallel.

3. The integrated circuit chip according to claim 2, wherein said at least one microcode sequencer includes a self-test logic circuit;

a multiplexer coupled to said self-test logic circuit, said multiplexer being configured to receive a plurality of test instructions as input and to be controlled by said self-test logic circuit to output one of said plurality of test instructions every write cycle to perform bitwise testing of the programmable memory element; and a test address generation circuit coupled to said self-test logic circuit and coupled to the programmable memory element, said test address generation circuit being configured to produce successive count values for bitwise addressing of the programmable memory element during each of said write cycles and subsequent read cycles.

4. The integrated circuit chip according to claim 3, wherein said multiplexer of said at least one microcode sequencer is coupled to a plurality of registers, each of said plurality of registers being configured to contain one of said plurality of test instructions.

5. The integrated circuit chip according to claim 3, wherein said test address generation circuit of said least one microcode sequencer is selectively coupled to the programmable memory element.

6. The integrated circuit chip according to claim 3, wherein said test address generation circuit is a counter.

7. The integrated circuit chip according to claim 3, wherein said at least one microcode sequencer further includes a signature element, said signature element being configured to receive, during each of said read cycles, contents of the programmable memory element provided during said write cycles.

\* \* \* \* \*